(12) United States Patent
Dingemans

(10) Patent No.: US 9,839,141 B2
(45) Date of Patent: Dec. 5, 2017

(54) METHOD FOR MANUFACTURING A COMPONENT INTERCONNECT BOARD

(75) Inventor: Antonius Petrus Marinus Dingemans, Tilburg (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 375 days.

(21) Appl. No.: 14/239,549

(22) PCT Filed: Aug. 30, 2012

(86) PCT No.: PCT/IB2012/054458
§ 371 (c)(1),
(2), (4) Date: Feb. 19, 2014

(87) PCT Pub. No.: WO2013/035021
PCT Pub. Date: Mar. 14, 2013

(65) Prior Publication Data
US 2014/0215817 A1    Aug. 7, 2014

Related U.S. Application Data

(60) Provisional application No. 61/596,758, filed on Feb. 9, 2012.

(30) Foreign Application Priority Data

Sep. 6, 2011  (EP) .................................... 11180233

(51) Int. Cl.
*H05K 3/34* (2006.01)
*H05K 3/30* (2006.01)
(Continued)

(52) U.S. Cl.
CPC ............... *H05K 3/303* (2013.01); *F21K 9/90* (2013.01); *F21V 21/002* (2013.01);
(Continued)

(58) Field of Classification Search
CPC .... H05K 3/202; H05K 3/0058; H05K 3/0097; H05K 2201/09263; H05K 2201/09781;
(Continued)

(56) References Cited

U.S. PATENT DOCUMENTS 5,470,644 A * 11/1995 Durant .................... B32B 15/08
156/233
2003/0137839 A1 * 7/2003 Lin ........................ H05K 1/189
362/237

(Continued)

FOREIGN PATENT DOCUMENTS

CN    101683009 A    3/2010
DE    102010000758 A1    7/2011

*Primary Examiner* — Peter DungBa Vo
*Assistant Examiner* — Azm Parvez

(57) ABSTRACT

There is provided a method for manufacturing a component interconnect board (150) comprising a conductor structure for providing electrical circuitry to at least one component (114) when mounted on the component board, the method comprising providing a conductor sheet (100) with a first predetermined pattern (115), providing a solder resist sheet (112) with a second predetermined pattern for defining solder areas (125) of the component board, forming a subassembly (120) by laminating the solder resist sheet on top of the conductor sheet, applying solder onto the subassembly, placing the at least one component onto the subassembly, performing soldering, and laminating the subassembly to a substrate (130). The solder resist sheet is further arranged to act as a carrier for the conductor sheet.

11 Claims, 5 Drawing Sheets

(51) Int. Cl.

| | | |
|---|---|---|
| *H05K 3/20* | (2006.01) | |
| *H01L 25/075* | (2006.01) | |
| *F21K 9/90* | (2016.01) | |
| *H01L 27/15* | (2006.01) | |
| *H01L 33/62* | (2010.01) | |
| *F21V 21/002* | (2006.01) | |
| *H05K 13/04* | (2006.01) | |
| *H05K 1/02* | (2006.01) | |
| *H05K 3/00* | (2006.01) | |
| *H05K 1/05* | (2006.01) | |

(52) U.S. Cl.
CPC ........ *H01L 25/0753* (2013.01); *H01L 27/153* (2013.01); *H01L 33/62* (2013.01); *H05K 1/0283* (2013.01); *H05K 3/202* (2013.01); *H05K 13/046* (2013.01); *H01L 2924/0002* (2013.01); *H05K 1/0209* (2013.01); *H05K 1/0284* (2013.01); *H05K 1/05* (2013.01); *H05K 3/0058* (2013.01); *H05K 3/0097* (2013.01); *H05K 2201/09263* (2013.01); *H05K 2201/09781* (2013.01); *H05K 2201/10106* (2013.01); *H05K 2203/04* (2013.01); *H05K 2203/1545* (2013.01); *H05K 2203/175* (2013.01); *Y10T 29/49144* (2015.01)

(58) Field of Classification Search
CPC . H05K 2201/10106; H05K 2203/1545; H05K 2203/175; H05K 2203/04; Y10T 29/49144; Y10T 29/49128; Y10T 29/49002
USPC ................ 29/840, 832, 829, 825, 592.1, 831
See application file for complete search history.

(56) References Cited

U.S. PATENT DOCUMENTS

| | | | |
|---|---|---|---|
| 2006/0032907 A1* | 2/2006 | Zercher | G06K 19/07749 235/380 |
| 2009/0050355 A1* | 2/2009 | Chun | B32B 15/08 174/257 |
| 2009/0174301 A1* | 7/2009 | Frey | F21K 9/00 313/1 |
| 2009/0250258 A1* | 10/2009 | Warigaya | H05K 3/3452 174/260 |
| 2009/0294953 A1* | 12/2009 | Hwan | H01L 23/49572 257/699 |

* cited by examiner

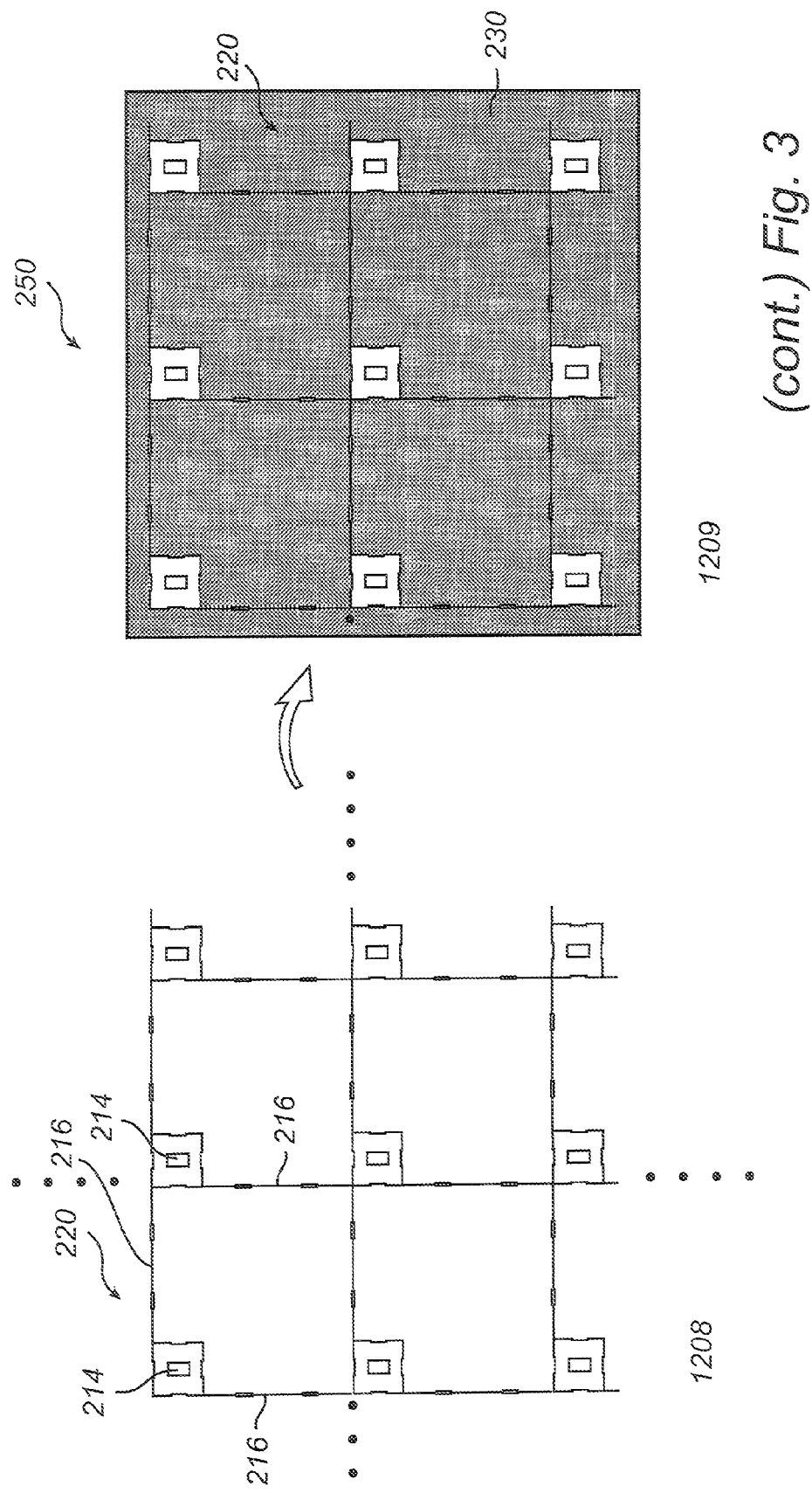

METHOD FOR MANUFACTURING A COMPONENT INTERCONNECT BOARD

TECHNICAL FIELD

The present invention generally relates to the field of light emitting diode luminaires, and more particularly to a method for manufacturing a component interconnect board for light emitting diode luminaires.

BACKGROUND OF THE INVENTION

In the cost breakdown of light emitting diode (LED) luminaires, the component to circuitry interconnect solution, or when the component is part of the circuitry, herein under referred to as a level two (L2) interconnect, is becoming increasingly important because of two main reasons. Firstly, the LED costs are decreasing, and secondly, in many LED luminaire designs, there is little room left to have a cost down on for example the housing parts. Both reasons lead to a relative increase of importance of the L2 interconnect on the total system costs.

FIG. 1 schematically illustrates a typical L2 interconnect in which a component, here a packaged LED 10, is interconnected with a LED board 50 being a printed circuit board, PCB, by means of soldering. A LED board is usually provided as a stack. The LED board 50 comprises a carrying substrate 51 for providing a required robustness, or flexibility, of the LED board 50. One or more dielectric layers 55 for providing a basic insulation of the LED board 50 is typically laminated together with epoxy resin onto the substrate 51. On top of the substrate 51, a conductor layer is also laminated over the full surface area. The conductor layer is thereafter chemically etched to provide for the final conductor structure 52 and circuitry. This etching process is by nature a discontinuous batch process. The LED 10 is interconnected to the conductor structure 52 by means of soldering. Before applying solder 53 to the LED board it is typically coated with a solder mask, a patterned solder resist layer 54, defining areas where solder is to be applied. The solder resist layer 54, which is typically 20-30 micrometers thick, may be a polymer coating applied in an offset process of a dispensed and cured polymer material. The solder resist layer 54 prevents solder from bridging between conductors 52 thereby creating short circuits, and may further provide protection from the environment.

Whereas the whole stack of a PCB is typically produced by lamination, the actual final end result for the conductor circuitry 52 and solder resist 54 is created by a discontinuous process. These batch processes do not come down in cost significantly with larger volumes in production.

Further, with respect to material utilization, there is little flexibility in playing with the essential and valuable conductor layer properties. When providing the conductor structure 52, firstly a copper layer is applied to the full L2 process plate surface, followed by patterning and removing of copper, which cost time and saturates the chemical etching dissolvent. Growing a thicker layer, for better heat management, also cost extra time and energy.

In addition to the standard PCB type of L2 interconnect described above, there are many other types of L2 interconnects, which are mostly not relevant for reasons of high cost and complexity. One solution that is of relative low cost and which may be used for less complex circuitries is using lead-frames. In general this means putting components on a rigid, possibly bended, conductor frame, which is processed in a final stage to provide for the required circuitry. The lead-frame can be produced in different ways depending mostly on size and complexity e.g. mechanical stamping or chemical etching. There are some typical drawbacks to this approach. Firstly with creating the final circuitry the initial lead-frame will lose its mechanical integrity literally falling apart. One can either design to have mechanical stresses going through the electrical components such as is typical in larger mechanical lead-frames, or one can introduce some feature, e.g. plastic overmoulding, to provide for the necessary rigidity while the final circuitry is created before electrical components can be placed. Furthermore in general these types of solutions do not provide for the necessary electronic insulation requirements whereas dielectrics are not or only applied in limited areas. Prescribed creepage and clearance distances are difficult to manage or incorporate into the L2 interconnect design and must mostly be managed on a luminaire/system level. Finally if one wants to optimize for thermal management and the heat spreader and/or heat sink is made out of conductive material one has to introduce a separate dielectric component on a luminaire/system level.

SUMMARY OF THE INVENTION

In view of the above, an object of the invention is to at least alleviate the problems discussed above. In particular, an object is to provide a method for manufacturing a component interconnect board in a more material efficient, faster and more economical manner.

This object is achieved by a method for manufacturing a component interconnect board according to the present invention as defined in claim 1. The invention is based on the insight that by starting from sheet based solder resist and conductor materials, and utilizing the solder resist sheet to function as a carrier for the conductor sheet, mechanical processing can be used in order to make the final circuitry.

Thus, in accordance with an aspect of the present invention, there is provided a method for manufacturing a component interconnect board comprising a conductor structure for providing electrical circuitry to at least one component when mounted on the component board. The method comprises providing a conductor sheet with a first predetermined pattern, providing a solder resist sheet with a second predetermined pattern for defining solder areas of the component board, forming a subassembly by laminating the solder resist sheet on top of the conductor sheet, applying solder onto the subassembly, placing the at least one component onto the subassembly, performing soldering, and laminating the subassembly to a substrate. In the subassembly, the solder resist sheet is further arranged to act as a carrier for the patterned conductor sheet, thereby maintaining integrity of the subassembly, during steps of the manufacturing. The manufacturing and assembling of the circuitry are thus decoupled from the substrate, which is advantageous in that the substrate can be chosen freely e.g. to provide for proper thermal dissipation, provide low light leakage from LEDs mounted on the component interconnect board, or to provide controllable creepage and clearance distances. Decoupling further allows separate processing of the carrier substrate in order to optimize the substrate and use its specific mechanical, optical or thermal properties to the full extent.

Further, a high utilization factor of high value materials like copper and aluminium is obtainable when providing the conductor structure from a patterned conductor sheet. This is particularly true when one stretches a single circuitry sub assembly, or distributes multiple circuitry sub assemblies, over a larger substrate, as will be further described below.

Due to the use of sheet materials, the present method may be implemented in a roll-to-roll process which is advantageous. Contrary to batch processes, which as mentioned above do not come down in cost significantly with larger volumes in production, continuous processes, like roll-to-roll processes, are very sensitive to economies of scale and are therefore cost effective for high volume production. In a roll-to-roll process large dimensions of the circuitry are allowed, e.g. infinite length is possible. There is no need for expensive L2 interconnect to L2 interconnect connectors on a luminaire/system.

Further, the present inventive method can provide high capacity utilization of machinery, because the subassembly and intermediate products can be produced and stocked separately. Every step of the manufacturing method may correspond to its own flexible machine.

Generally the present invention provides for a high freedom in layout design compared to lead-frame type solutions. This is because in the design of a lead-frame type of L2 interconnect there is a trade off between freedom in circuitry layout and mechanical rigidity/integrity. In the present invention the two different functionalities are managed by two different layers. Furthermore in current PCB type of L2 interconnect solutions one can either chose to apply free shaping of contours by a relatively expensive milling process step, or one is limited to linear cutting resulting in typical rectangular shapes. In the present invention the circuitry assembly is decoupled from the substrate which means that designing for a larger or more complex final assembly does mostly affect the substrate design and material utilization whereas the more valuable circuitry assembly may remain unchanged.

According to an embodiment of the method, it further comprises cutting the subassembly to provide the conductor sheet with a final predetermined pattern corresponding to the conductor structure, which is advantageous if the first predetermined pattern is not corresponding to the desired conductor structure.

According to embodiments of the method, it further comprises providing mechanical deformation of the subassembly by means of one of splitting, trimming of the subassembly to a predetermined contour, and stretching. For instance, to create large dimensions of the component interconnect board, it may be advantageous to create the circuitry and do the pick and placing of components first, and subsequently stretch the subassembly to a desired size before finally transferring it to the substrate. Preferably, the conductor structure is provided with extractable conductor portions. The component pick and placing is then performed with an as high as possible density, which is advantageous. Preferably, the subassembly comprising the conductor structure with extractable conductor portions is then stretched to an optimized total surface area and thickness before putting it on a carrier substrate. The substrate may be a final product or carrier, like for instance a luminaire housing part, an internal or external reflector, glass window pane, acoustically absorbing foam etc.

The separation of the manufacturing of the circuitry from the substrate further allows integration of various further functionalities in the substrate, like mechanical fixation, optical reflector and electrical connector before applying the subassembly to the substrate.

According to embodiments of the method, it further comprises providing three dimensional deformation of the subassembly for providing one of: optical properties, like specular or diffuse reflector, mechanical fixation of the component interconnect board, e.g. by bending or protrusions, mechanical fixation of additional components, like near die optics or local heat sinks, thermal properties, and connector functionality.

According to embodiments of the invention, the substrate may be is flexible and/or three dimensional.

Further, the substrate may in an embodiment of the method be mechanically deformed. This may be done by one of splitting, and trimming of the substrate to a predetermined contour.

According to embodiments of the method, it further comprises providing three dimensional deformation of the substrate for providing one of optical properties, like specular or diffuse reflector, mechanical fixation of the component interconnect board, e.g. by bending or providing protrusions, mechanical fixation of additional components, like e.g. near die optics or local heatsinks, thermal properties, and connector functionality. Optionally, the subassembly can incorporate features for providing additional functionalities, such as mounting or positioning features, such as providing snap fit features, slots or holes for primary optics, increasing the stiffness, e.g. by profiling.

According to an embodiment of the method, the conductor structure is further arranged to function as a connector.

According to an embodiment of the method, at least one of the first predetermined pattern and the second predetermined pattern is done by means of cutting, punching, or slitting.

The described invention is broadly applicable in LED products. For LED modules, LED lamps which have a relatively high thermal load to volume ratio it is highly advantageous because the solution can be optimized for thermal management while still being low cost. For LED board platforms, and large area luminaires in general it is advantageous because the solution provides for a novel way to distribute LEDs over large surface areas while still being low cost and possibly even incorporate a luminaire housing functionality.

Other objectives, features and advantages will appear from the following detailed disclosure, from the attached dependent claims as well as from the drawings.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DETAILED DESCRIPTION OF PREFERRED EMBODIMENTS

Exemplifying embodiments of the method for manufacturing a component interconnect board according to the present invention is now described with reference to FIGS.

2, 3 and 4. The steps of the method are shown as a numerical sequence, however some of the steps may be performed in another order.

Figure 1:
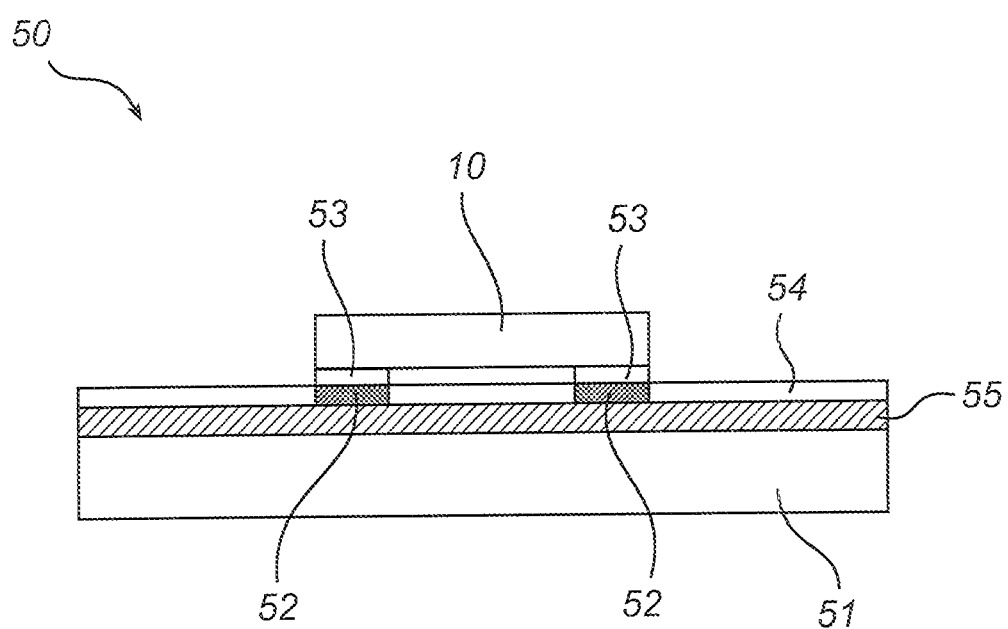
FIG. 1 is a cross sectional side view schematically illustrating a prior art L2 interconnect.
Figure 2:
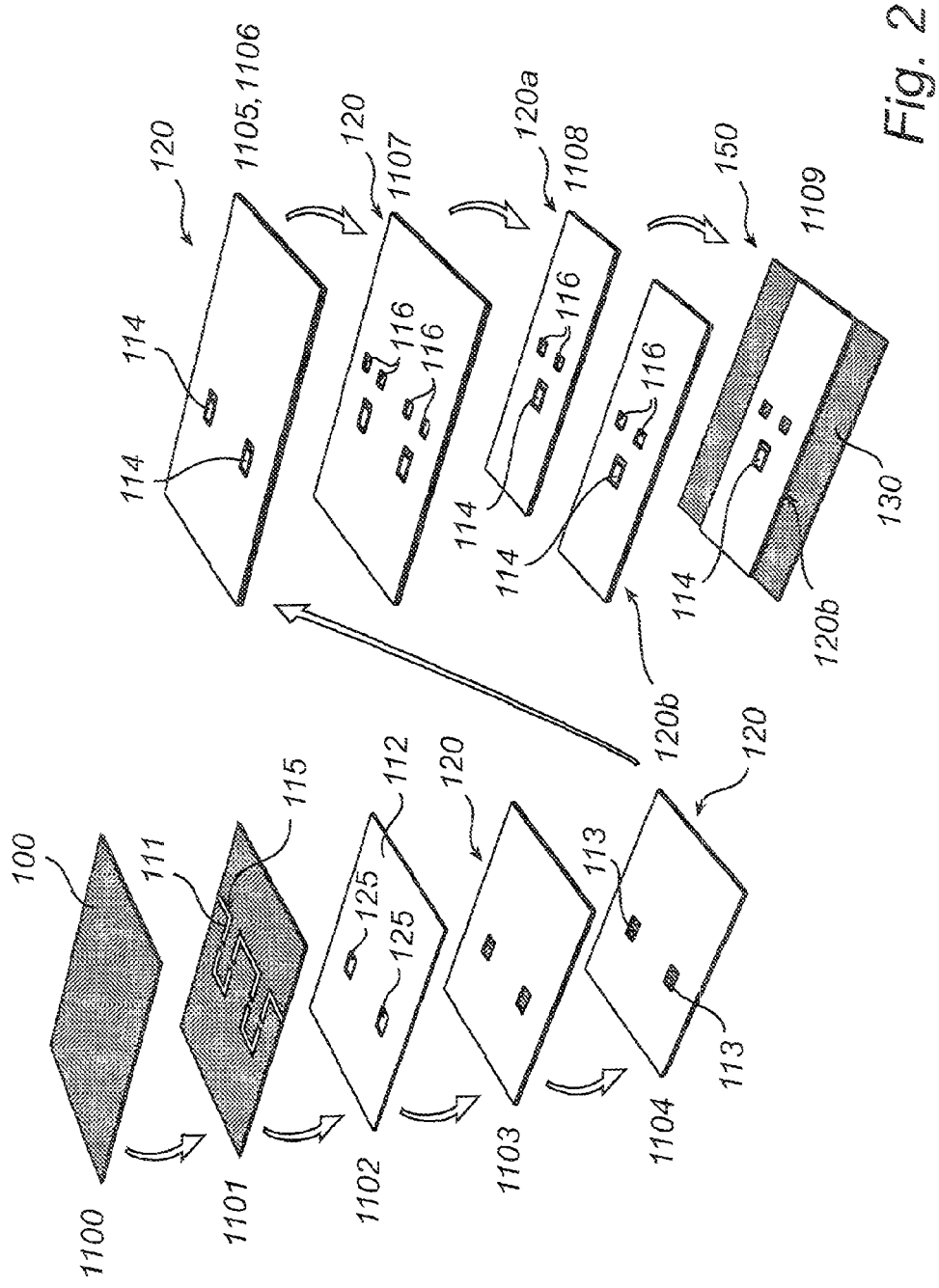
FIG. 2 is a flow chart schematically illustrating an embodiment of a method according to the present invention.

With reference now to FIG. 2, and starting at step 1100, a conductor sheet 100 is initially provided. The conductor sheet 100 is preferably selected amongst a group of metal sheet materials comprising copper and silver. The conductor sheet 100 is in step 1101 pre-cut to apply a first predetermined pattern 115 corresponding to a specific electronic layout while still maintaining the necessary integrity.

In a parallel step 1102, a solder resist sheet 112 is pre-cut to provide a second predetermined pattern, here defining openings 125 for defining solder areas, while still maintaining the necessary integrity.

Figure 4:
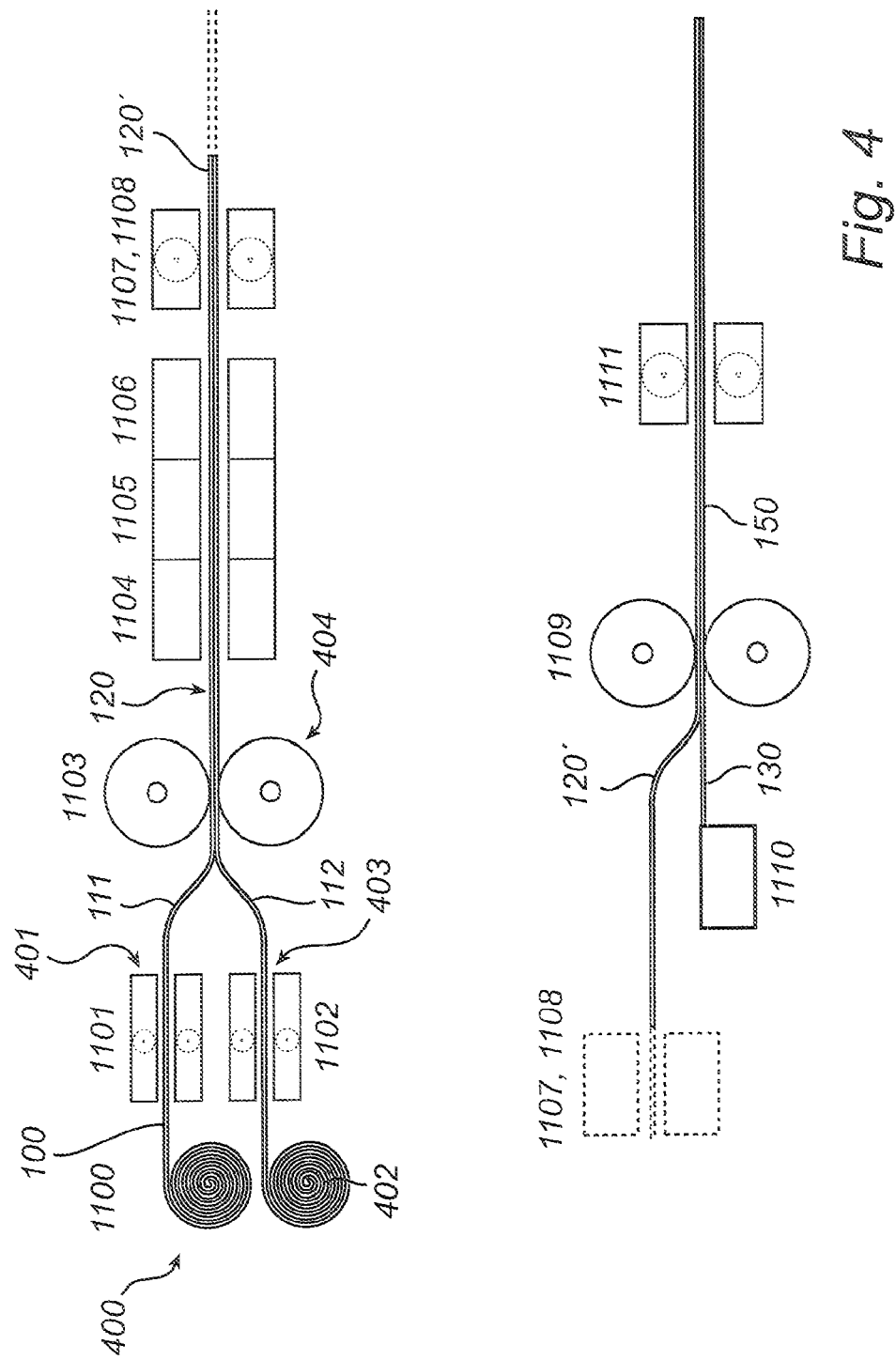
FIG. 4 is a schematic illustration of an embodiment of the method according to the present invention when implemented in a roll-to-roll manufacturing line.

The maintained integrity of the patterned conductor sheet 111 and the patterned solder resist sheet 112 is of particularly importance when at least steps of the method are implemented in a roll-to-roll process, which is described herein under with reference to FIG. 4.

To continue with reference to FIG. 2, the patterned conductor sheet 111 and the patterned solder resist sheet 112 is in step 1103 laminated to form a subassembly 120.

In step 1104, solder 113 is applied to cleared areas defined by the openings 125 in the solder resist sheet 112.

Subsequently, in step 1105, pick and placing of components 114, being for instance LEDs, is performed followed by soldering, which may be a reflow soldering process, in step 1106. Optionally, if necessary, the subassembly 120 is in step 1107 cut to provide for a final predetermined pattern 116 corresponding to the conductor structure, i.e. the electronic circuitry of the components 114. In step 1108 the subassembly 120, now containing both the final circuitry and components 114, is split (cut) in multiple parts here forming two subassemblies, 120a and 120b. In a final step 1109, the parts 120a (not shown) and 120b of the subassembly 120 are laminated to an appropriate substrate 130, taking into account creepage and clearances, resulting in a component interconnect board 150. In embodiments of the method, the substrate or the component interconnect board may be further mechanically deformed to add functionalities, e.g. mounting features or positioning features for primary optics.

The mechanical deforming of the subassembly in step 1108 is optional, and can in embodiments of the method comprise trimming of the subassembly (and/or parts of the subassembly when performing splitting of the subassembly, as described in step 1108 above) to a predetermined contour.

Figure 3:
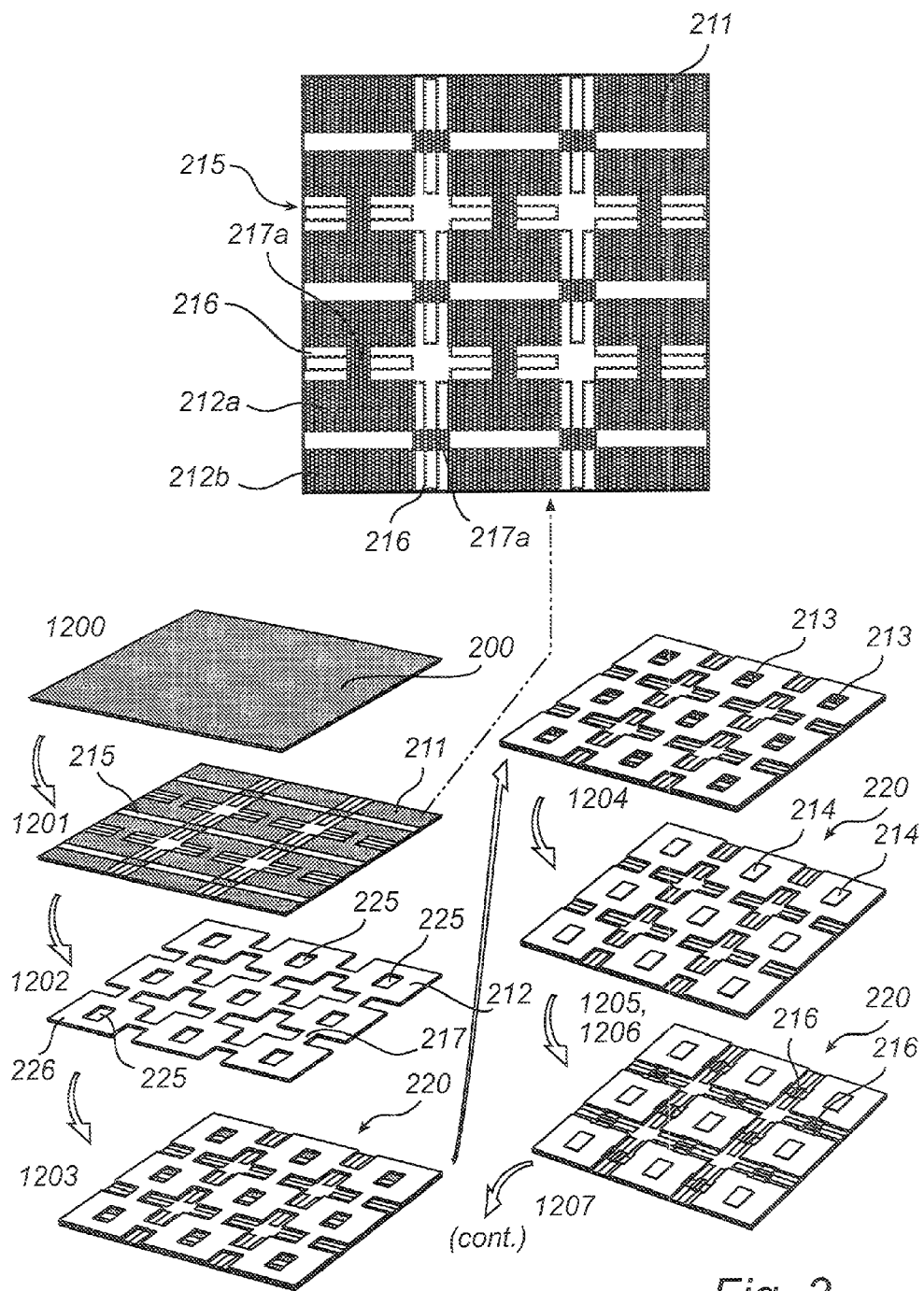
FIG. 3 is a flow chart schematically illustrating an embodiment of a method according to the present invention.

FIG. 3 is a flow chart schematically illustrating an embodiment of a method according to the present invention. Starting at step 1200, a conductor sheet 200 is initially provided. The conductor sheet 200 is in step 1201 pre-cut to apply a first predetermined pattern 215 corresponding to a specific electronic layout while still maintaining the necessary integrity. The first predetermined pattern 215 comprises of a matrix of m×n component areas, $C_{n \times m}$, arranged in n rows and m columns, here n=3 and m=3, see for instance connect areas 212a and 212b, to which components are to be soldered, in the schematic close up of the patterned conductor sheet 211, which connect areas 212a and 212b together constitute a component area $C_{3,1}$. Further, substantially U-shaped conductor portions 216 are arranged to interconnect adjacent conductor areas $C_{n,m}$. As illustrated in FIG. 3, the conductor portions 216 are cut out from the conductor sheet 200 with maintained integrity by keeping a bridge part 217a.

In a parallel step 1202, a solder resist sheet 212 is pre-cut to provide a second predetermined pattern, here comprising covering areas 226, corresponding to each component area $C_{n,m}$ of the patterned conductor sheet 211 in which openings 225 for defining solder areas are arranged. Further, each covering area 226 is interconnected with a bridge 217 arranged at positions corresponding to bridge parts 217a of the patterned conductor sheet 211.

Maintained integrity of the patterned conductor sheet 211 and the patterned solder resist sheet 212 is of particularly importance when at least steps of the method are implemented in a roll-to-roll process, which is described herein under with reference to FIG. 4.

To continue with reference to FIG. 3, in step 1203 the patterned conductor sheet 211 is laminated to the patterned solder resist sheet 212 to form a subassembly 220. In step 1204, solder 213 is applied to cleared areas defined by the openings 225. Subsequently, pick and placing of components 214, being for instance LEDs, in step 1205 is performed followed by soldering, which may be a reflow soldering process, in step 1206.

In step 1207, the subassembly 220 is cut to provide for a final predetermined pattern corresponding to the conductor structure, i.e. the electronic circuitry to the components 214. Here, the part of the bridges 217a and 217 are simultaneously trimmed, e.g. by punching, such that the conductor portions 216 are no longer bridged.

In step 1208 the subassembly 220, now containing both the final circuitry and components 214, is mechanically deformed. The matrix of component areas $C_{n \times m}$ is stretched, thereby straightening out the conductor portions 216 such that the distance between the components 214 and the L2 interconnect surface area (area of subassembly 220) increases. Here, the stretching is done in two dimensions.

In a final step 1209, the stretched subassembly 220 is laminated to an appropriate substrate 230, taking into account creepage and clearances, resulting in a component interconnect board 250. In embodiments of the method, the substrate or the component interconnect board may be further mechanically deformed to add functionalities, e.g. mounting features or positioning features for primary optics.

According to an embodiment of the method according to the present invention, it is implemented in a roll-to-roll process to produce a large number of lighting devices (i.e. final product devices corresponding to component interconnect boards according to the present invention). In a roll-to-roll process, the production facilities are equipped to carry out major parts of the production with sheet materials feed by rolls instead of individual sheets. Referring now to FIG. 4, which schematically illustrates a roll-to-roll manufacturing line, including machinery used for patterning, slitting and laminating steps of the present method. The manufacturing line is here at least partly described with reference to reference numbers and method steps of the method as described with reference to FIG. 2. However, in the roll-to-roll process, the steps are described with reference to films instead of referring to individual sheets, e.g. conductor sheet 100 is here referred to as conductor film 100. To continue with reference to FIG. 4, a conductor film 100 is supplied from a feed roll 400 [step 1100] into a pattering machine 401, in which a continuous series of the first predetermined pattern 115 is punched out or cut out [step 1101]. In a parallel process, a patterned resistor film 112 is provided from a feed roll of resistor film 402 fed into a patterning machine 403, in which a continuous series of the second predetermined pattern 125 is punched out or cut out [step 1102]. The patterned conductor film 111 and the patterned resistor film 112 are then fed into a laminating station 404 (e.g. by applying an adhesive and or mechanical pressure and high temperature) to form the subassembly film 120. The subassembly film 120 is subsequently fed into machinery for applying solder [step 1104], pick and placing of components [step 1105], soldering of components [step 1106] and mechanical deformation of the subassembly film [steps 1107, 1108], e.g. to provide the final circuitry, and form separate subassemblies 120' corresponding to respective lighting devices. Here, after the circuitry making is completed, desired substrates 130 are provided. The substrates may be separate substrates provided on a feeding line after steps of manufacturing including desired deformation etc. [step 1110, not shown in FIG. 2]. The substrates can also be provided directly from a feed roll.

Decoupling of the manufacturing of the subassembly from the substrate is advantageous since it allows specific processes to run in their natural speeds, and further increases the flexibility of the processing component interconnect boards of different designs in the same processing line.

Further, decoupling of the processing of the subassembly and the substrate facilitates for adding or removing optional processing steps from the process line, for instance a 3D shaping of the subassembly may be removed from the processing if not necessary for a specific component design. Also when changing from one design in factory to another design in factory, if processes are decoupled, it is not longer necessary to exchange tooling for all process steps before machines are made operable again.

To continue with reference to FIG. 4, finally the subassemblies 120' and the substrate 130 are laminated to form final products 150 [step 1109]. Optionally, a final process step, e.g. cutting to separate products, applying extra environmental encapsulation etc. may be performed on the final products [step 1111].

Machinery utilizing rolling tools are advantageous for their very high speed performance, and can be used one or more of the different method steps, which is indicated by dashed rolls in the steps 1101, 1102, 1107, 1108 and 1111 in FIG. 4.

In the steps of the roll-to-roll process as described above, there might exist a difference in speed for the respective step. In particular, the step of pick and placing of components [step 1105] is a process step that has different processing speed for different designs of the circuitry. This relatively valuable process step is associated with costly machines, and may therefore become a bottleneck for the whole manufacturing line. According to an embodiment of the method (not shown), the pick and placing of components is therefore moved out of line from the roll-to-roll process as described with reference to FIG. 4. This way with every new design the roll-to-roll manufacturing line can operate at an optimized speed providing for the highest machine utilization factor. The speed may further be variable within a specific design. Thereby, different designs of the respective lighting devices can be created using the same manufacturing line with flexible tooling. Ultimately this means that a manufactured subassembly 120 up to and including step 1103 is an intermediate result, which may be created with multiple designs 120$^a$, 120$^b$ etc. These are put on stock to create a necessary buffer which is a result of the variable speed of pick and placing step 1105.

The invention has mainly been described above with reference to a few embodiments. However, as is readily appreciated by a person skilled in the art, other embodiments than the ones disclosed above are equally possible within the scope of the invention, as defined by the appended claims.

The invention claimed is:

1. A method for manufacturing a component interconnect board comprising a conductor structure for providing electrical circuitry to at least one component when mounted on said component interconnect board, said method comprising:

providing a pre-cut conductor sheet with a first predetermined pattern;

providing a pre-cut solder resist sheet with a second predetermined pattern for defining solder areas of said component interconnect board;

forming a subassembly by laminating said pre-cut solder resist sheet on top of said pre-cut conductor sheet;

applying solder onto said subassembly including said solder areas;

placing said at least one component onto said subassembly;

performing soldering with said at least one component onto said subassembly;

splitting said subassembly into a plurality of subassemblies; and laminating at least one of the subassemblies to a substrate;

wherein, in said subassembly, said solder resist sheet is further arranged to act as a carrier for said conductor sheet.

2. A method according to claim 1, further comprising cutting said subassembly to provide said conductor sheet with a final predetermined pattern corresponding to said conductor structure.

3. A method according to claim 1, further comprising providing mechanical deformation of said subassembly by means of one of splitting, trimming of the subassembly to a predetermined contour, and stretching.

4. A method according to claim 1, further comprising providing three dimensional deformation of said subassembly for providing one of: optical properties, mechanical fixation of said component interconnect board, mechanical fixation of additional components, thermal properties, and connector functionality.

5. A method according to claim 1, wherein said substrate is flexible.

6. A method according to claim 1, further providing mechanical deformation of said substrate by means of one of splitting, and trimming of the substrate to a predetermined contour.

7. A method according to claim 1, wherein said conductor structure is further arranged to function as a connector.

8. A method according to claim 1, wherein at least one of said first predetermined pattern, and said second predetermined pattern is done by means of cutting, punching, or slitting.

9. A method according to claim 1, performed in a roll-to-roll process.

10. A method according to claim 1, wherein said first predetermined pattern is provided with extractable conductor portions.

11. A method according to claim 1, wherein said substrate is three dimensional.

* * * * *